United States Patent [19]

Kuno et al.

[11] Patent Number: 4,472,682

[45] Date of Patent: Sep. 18, 1984

[54] APPARATUS FOR GENERATING A PARALLEL MAGNETIC FIELD WITHIN A MAGNETICALLY SHIELDED HOUSING

[75] Inventors: Akira Kuno, Oobu; Muneaki Matsumoto, Okazaki; Koji Numata, Toyokawa, all of Japan

[73] Assignee: Nippon Soken, Inc., Nishio, Japan

[21] Appl. No.: 284,945

[22] Filed: Jul. 20, 1981

[30] Foreign Application Priority Data

Jul. 22, 1980 [JP] Japan .......................... 55-104352[U]

[51] Int. Cl.³ ...................... G01N 27/72; G01R 33/12
[52] U.S. Cl. ..................................... 324/228; 324/262
[58] Field of Search ............. 324/225, 228, 234, 236, 324/239, 262

[56] References Cited

U.S. PATENT DOCUMENTS

| | | | |
|---|---|---|---|
| 1,559,085 | 10/1925 | Goknale | 324/225 |
| 2,531,807 | 11/1950 | De Pangher | 324/234 |
| 2,621,234 | 12/1952 | Buchl | 324/228 |
| 2,819,447 | 1/1958 | Harmon | 324/236 |

Primary Examiner—Gerard R. Strecker
Assistant Examiner—Walter E. Snow
Attorney, Agent, or Firm—Cushman, Darby & Cushman

[57] ABSTRACT

An apparatus for generating a parallel magnetic field by passing current through a coil cylindrically wound and shielded against the external magnetic fields by a magnetically shielded housing incorporating a fine meshed material such as a high magnetic permeability amorphous alloy. Inside the housing, there are provided a non-magnetic bobbin, on which the coil is wound, and a power source for providing current to the coil to produce a parallel magnetic field of an intensity corresponding to that of the current to be generated within the bobbin.

3 Claims, 2 Drawing Figures

APPARATUS FOR GENERATING A PARALLEL MAGNETIC FIELD WITHIN A MAGNETICALLY SHIELDED HOUSING

BACKGROUND OF THE INVENTION

1. Field of the Invention

This invention relates to apparatus for generating a parallel magnetic field within a magnetically shielded housing for testing magnetic sensors, such as direction indicator sensors for vehicle electronic compass.

2. Description of the Prior Art

In the prior art parallel magnetic field generators are known wherein current is passed through a cylindrically wound coil shielded against external magnetic fields by a housing made of an iron or permalloy plate, and wherein a sample to be tested is set in the parallel magnetic field thus produced and is externally rotated about an axis parallel to the magnetic field by a rotational direction converting mechanism which permits external readout of the rotational angle.

However, in such prior art parallel magnetic field generators the mechanism for rotating the sample is complicated. In addition, where gears are used for the rotational direction converting mechanism, it is difficult to improve the precision of the display of the angle of the sample with respect to the parallel magnetic field due to play between the gears. Furthermore, where an iron plate is used for the magnetically shielded housing, the shielding is limited. The iron plate has to be demagnetized, and the apparatus as a whole is heavy. Where a permalloy magnetically shielded housing is used, strain is liable to be produced at the time of manufacture.

SUMMARY OF THE INVENTION

An object of the invention is to provide a parallel magnetic field generating apparatus, in which a coil for generating a parallel magnetic field is wound on a non-magnetic cylindrical bobbin shielded against an external magnetic field by a magnetically shielded housing constructed by applying a high magnetic permeability amorphous alloy over a non-magnetic base. A parallel magnetic field of a desired intensity is generated within the bobbin by a corresponding current passed through the coil. With this construction, the parallel magnetic field can be readily generated within the bobbin, while also facilitating manufacture, reducing the weight of the apparatus, and enhancing its magnetic shielding effect without requiring de-magnetization.

DESCRIPTION OF THE PREFERRED EMBODIMENTS

Figure 1:
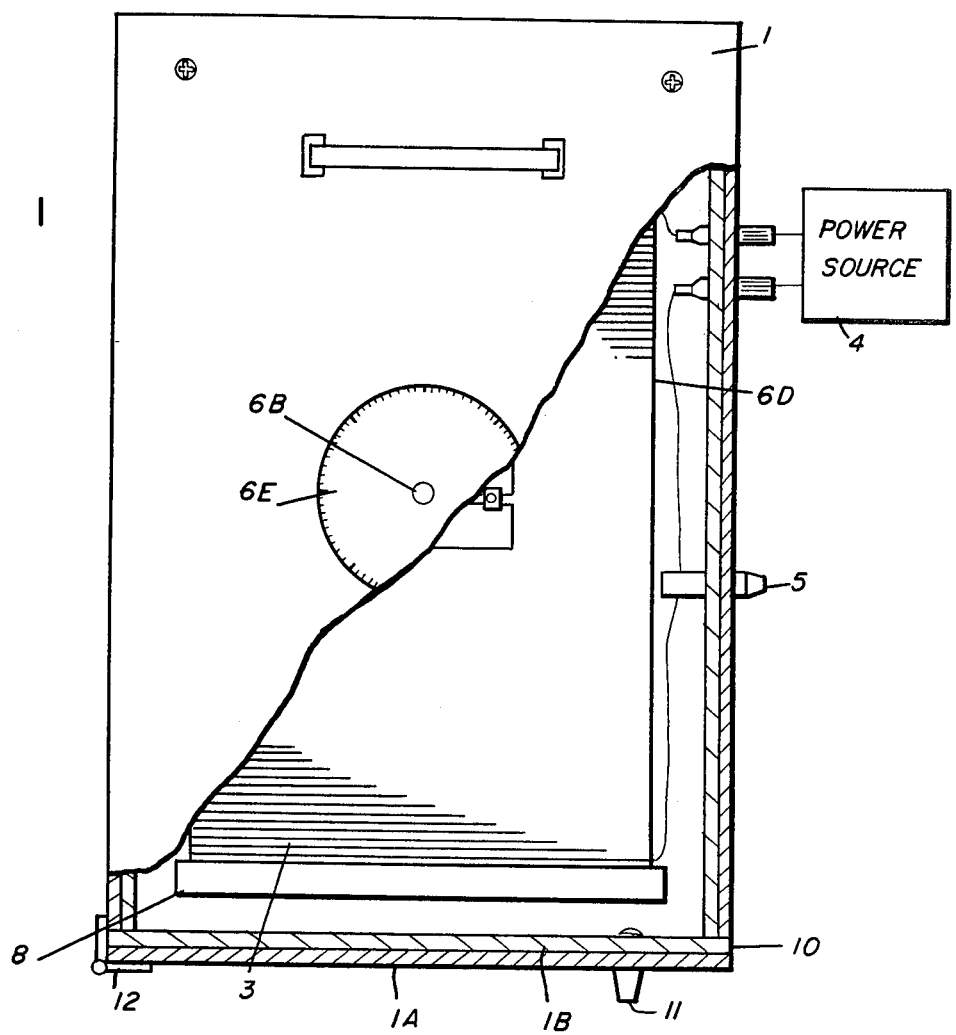
FIG. 1 is a plan view, partially in section, showing a parallel magnetic field generating apparatus according to the present invention.

Now, a preferred embodiment of the invention will be described with reference to the accompanying drawings. Designated as 1 is a housing which provides a shielding of its interior against an external magnetic field. The housing is constructed by securing a fine meshed material, such as "a high magnetic permeability amorphous alloy" (for instance "Metshield" by Allied Chemical Company in U.S.A.), on a base 1B made of a non-magnetic material (for instance acrylonitrile-butadiene-styrene copolymer). In the environment of terrestrial magnetism, the magnetic flux density within a housing of this type is about 1/40 of the terrestrial magnetism.

Designated as 2 is a cylindrical bobbin made of a nonmagnetic material (for instance vinyl chloride) and located within housing 1. The bobbin has about five times the diameter, and about ten times the length, of a sample (such as a direction indicator sensor) which is introduced within housing 1 as hereinafter described. On the bobbin 2, a coil 3 for generating a parallel magnetic field is wound. The coil 3 is connected at one end to a power source 4 and at the other end to a magnetic flux density adjustment resistor 5. By causing direct current of a given intensity to pass through the field generation coil 3, a direct current magnetic field of a corresponding intensity is generated within the bobbin 2 according to the Ampère rule. Also, it will be apparent that by causing alternating current of a given intensity to pass through the field generation coil 3, an alternating current magnetic field of a corresponding intensity is generated within the bobbin 2.

A sample magnetic sensor 9 to be tested is arranged on mounting section 6A which is located within the bobbin 2 vicinity of the bobbin's center. Section 6A is supported by a rotary assembly 6B having a rotary shaft 6C which extends at right angles to the parallel magnetic field between assembly 6B and the mounting section 6A. By externally rotating section 6B, the sample 9 is correspondingly rotated, i.e., at a ratio of 1:1. Forming further components of assembly 6B are a pointer 6D and an angle display plate 6E (having a 360° scale calibrated in 0.5° units) which permit measurement of the rotational angle of the sample 9, i.e., the angle of the sample 9 relative to the parallel magnetic field, with an accuracy of 0.5°. It will be obvious that the accuracy of the reading can be improved by making smaller the unit of the calibration of the angle display plate 6E.

Figure 2:
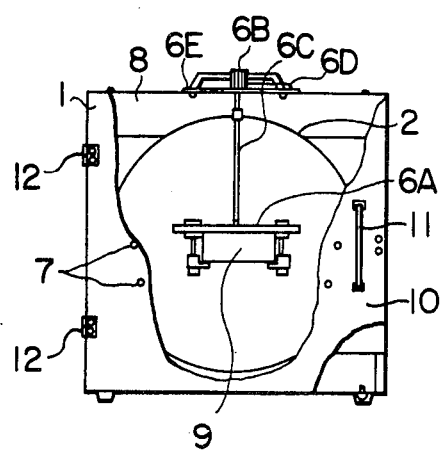
FIG. 2 is an elevational view, partially in section, showing the parallel magnetic field generating apparatus according to the present invention.

Referring to FIG. 2, designated as 7 are measurement holes which permit measurement of the distribution of the magnetic flux density within housing 1. Designated as 8 is a holder to which the bobbin 2 is secured, and designated as at 10 is a door having a handle 11. Door 10 is so constructed as to be opened and closed about a hinge 12 to permit entry of the sample 9 into the magnetic shielding housing 1.

With this embodiment, wherein a high permeability amorphous alloy is used as part of the magnetically shielded housing 1, the housing's weight can be reduced to about three-fifth of that of a housing wherein an iron plate having a thickness of 1.5 mm is used. In addition, with the present invention there is no need of de-magnetization, and the magnetic shielding effect can be roughly doubled. Furthermore, the intensity range of the parallel magnetic field set up by the coil 3 can be increased by two to four times.

Since the sample 9 is disposed in the parallel magnetic field such that it is perpendicular to the parallel magnetic field, and is mounted at one end of the rotary shaft 6C so that it can be externally rotated, the angle of the sample 9 with respect to the parallel magnetic field can be accurately and readily determined.

As has been described in the foregoing discussion, with a parallel magnetic field generating apparatus according to the invention, it is possible to: facilitate the manufacture and reduce the weight of the apparatus;, enhance its magnetic sheilding effect without need of de-magnetization; and permit the parallel magnetic field to be readily generated within the bobbin.

We claim:

1. An apparatus for generating a parallel magnetic field comprising a housing for shielding against external magnetic fields, said housing including a non-magnetic base and a high permeability amorphous alloy applied to said base, a cylindrical bobbin made of a non-magnetic material located within said housing, a coil for parallel magnetic field generation wound on said bobbin, and a power source joined to said coil for passing current through said coil to produce a parallel magnetic field within said bobbin having an intensity corresponding to the intensity of said current, wherein a side wall of said housing is provided with a plurality of measurement holes for measuring the state of distribution of magnetic flux density of said parallel magnetic field.

2. An apparatus according to claim 1, further comprising a magnetic flux density adjustment resistor connected between one end of said coil and said power source for adjusting the magnetic flux density of said parallel magnetic field.

3. An apparatus according to claim 1, further comprising a mounting section for supporting a sample within the parallel magnetic field, a rotary assembly supporting said mounting section, said assembly including a rotary shaft extending at right angles to the parallel magnetic field and being joined to the mounting section and to a pointer mounted in operative relationship with an angle display section wherein the angle of said sample with respect to said parallel magnetic field is indicated by said pointer and angle display section.

* * * * *